(12) United States Patent
Hu et al.

(10) Patent No.: US 8,554,817 B2
(45) Date of Patent: Oct. 8, 2013

(54) DATA RATE CONVERSION DEVICE AND METHOD

(75) Inventors: Gang Hu, Shanghai (CN); Yuanfei Nie, Shanghai (CN); Meiwu Wu, Shanghai (CN)

(73) Assignee: Montage Technology (Shanghai) Co., Ltd., Shanghai (CN)

( * ) Notice: Subject to any disclaimer, the term of this patent is extended or adjusted under 35 U.S.C. 154(b) by 856 days.

(21) Appl. No.: 12/727,908

(22) Filed: Mar. 19, 2010

(65) Prior Publication Data

US 2011/0179099 A1 Jul. 21, 2011

(30) Foreign Application Priority Data

Jan. 18, 2010 (CN) .......................... 2010 1 0004098

(51) Int. Cl.
*G06F 17/17* (2006.01)
*G06F 7/38* (2006.01)
*G06F 1/02* (2006.01)

(52) U.S. Cl.
USPC ........................... 708/313; 708/290; 708/271

(58) Field of Classification Search
USPC .................................................. 708/290, 313
See application file for complete search history.

(56) References Cited

U.S. PATENT DOCUMENTS

| | | | | |
|---|---|---|---|---|
| 5,382,913 A * | 1/1995 | Carson et al. | ................. | 327/141 |
| 6,014,682 A * | 1/2000 | Stephen et al. | ............... | 708/313 |
| 6,061,704 A * | 5/2000 | Ostman et al. | ............... | 708/313 |
| 6,215,423 B1 * | 4/2001 | May et al. | ........................ | 341/61 |
| 6,226,661 B1 * | 5/2001 | Savell | ............................ | 708/313 |
| 6,498,823 B1 * | 12/2002 | Samueli et al. | ............... | 375/371 |
| 6,563,448 B1 * | 5/2003 | Fontaine | ....................... | 341/143 |
| 6,584,162 B1 * | 6/2003 | Tinker | ........................... | 375/355 |
| 6,642,754 B1 * | 11/2003 | Dobramysl et al. | .......... | 327/105 |
| 7,061,409 B1 * | 6/2006 | Jantti et al. | ...................... | 341/61 |
| 7,302,459 B2 * | 11/2007 | Bossmeyer et al. | ........... | 708/313 |
| 7,440,987 B1 * | 10/2008 | Song et al. | ..................... | 708/276 |
| 7,477,170 B2 * | 1/2009 | Ananthaswamy | .............. | 341/61 |
| 7,912,882 B2 * | 3/2011 | Kim | ................................ | 708/271 |
| 8,076,977 B2 * | 12/2011 | Menkhoff | ..................... | 331/1 A |
| 2003/0204542 A1 * | 10/2003 | Mueller | ........................ | 708/290 |
| 2006/0290543 A1 * | 12/2006 | Ye | ................................... | 341/61 |
| 2008/0129557 A1 * | 6/2008 | Kong | .............................. | 341/61 |
| 2008/0256588 A1 * | 10/2008 | He et al. | ........................ | 725/131 |

* cited by examiner

*Primary Examiner* — Chat Do
*Assistant Examiner* — Matthew Sandifer
(74) *Attorney, Agent, or Firm* — Jun He Law Offices P.C.; James J. Zhu

(57) ABSTRACT

Data rate conversion devices and methods are provided. A method for converting a first digital signal having a first sampling rate into a second digital signal having a sampling rate close to a predetermined second sampling rate comprises the following operations: when the ratio of the first sampling rate to the second sampling rate is a repeating infinite decimal, calculate at least two calibrating coefficient values and output the calibrating coefficient values according to a predetermined rule; conduct overflow operation on the output calibrating coefficient; and interpolate the first digital signal using the output calibrating coefficient and the result of the overflow operation to obtain the second digital signal such that during any period of a certain length along time axis, sampling times of the second digital signal equals to sampling times of the second sampling rate.

16 Claims, 6 Drawing Sheets

DATA RATE CONVERSION DEVICE AND METHOD

PRIORITY CLAIM

This application claims the benefit of Chinese patent application number 201010004098.X, filed Jan. 18, 2010, which is incorporated herein by reference in its entirety.

BACKGROUND

The developmental direction of communication systems is compatible with multiple standards and multiple wave bands. In the case of mobile communication systems, four 3G standards, WCDMA, CDMA2000, TD-SCDMA, and WIMAX, have been commercialized; meanwhile the old 2G networks still cover most areas. In the case of wireless local area networks, 802.11 series and Hiperlan etc. coexist. In the case of family networks, IEEE 802.15 series, Bluetooth, and zigbee etc. coexist. In the case of simplex communication systems such as digital TV broadcasting, signals are transmitted using different standards in different wave bands. In these communication systems, a receiver needs to support a plurality of clock signals and be able to process signals with different spectrums. To simplify structure, resources are shared. As a result, software radio solutions using digital signal processing technologies are more and more popular. In these solutions, the received analogue signal is converted into a digital signal. Then the digital signal is processed in digital domain to depress noise and/or demodulate. After that, the processed digital signal is converted back into an analogue signal. A data rate conversion device having adjustable bandwidth is necessary in software radio solutions.

SUMMARY

In one aspect of the application, a device for converting a first digital signal having a first sampling rate into a second digital signal having a sampling rate close to or equal to a predetermined second sampling rate is provided. The device includes a numeric controlled oscillator for generating calibrating coefficient using the first sampling rate and the second sampling rate; and an interpolation filter for interpolating the first digital signal using the calibrating coefficient to obtain the second digital signal. When the ratio of the first sampling rate to the second sampling rate is a repeating infinite decimal, the numeric controlled oscillator calculates at least two calibrating coefficient values and outputs the calibrating coefficient values according to a predetermined rule such that during any period of a certain length along time axis, sampling times of the second digital signal equals to sampling times of the second sampling rate.

In some embodiments, the numeric controlled oscillator conducts overflow operation on the output calibrating coefficient, and sends to the interpolation filter the result of the overflow operation for controlling the validity of output of the interpolation filter.

In some embodiments, the numeric controlled oscillator includes a delta-sigma circuit for controlling output the calibrating coefficient values according to the predetermined rule.

In some embodiments, the numeric controlled oscillator includes a counter control circuit for controlling output the calibrating coefficient values according to the predetermined rule.

In some embodiments, the interpolation filter may be FIR filter, or IIR filter, or CIC filter, or HBF filter.

In another aspect of the application, a receiver of a communication system is provided. The receiver includes the device for converting a first digital signal having a first sampling rate into a second digital signal having a sampling rate close to or equal to a predetermined second sampling rate.

In another aspect of the application, a device for converting a first digital signal having a first sampling rate into a second digital signal having a sampling rate close to or equal to a predetermined second sampling rate is provided. The device includes a numeric controlled oscillator for generating calibrating coefficient using the first sampling rate and the second sampling rate; and an interpolation filter for interpolating the first digital signal using the calibrating coefficient to obtain the second digital signal. When the ratio of the first sampling rate to the second sampling rate is a repeating infinite decimal, the numeric controlled oscillator calculates at least two calibrating coefficient values and outputs the calibrating coefficient values according to a predetermined rule. At least one calibrating coefficient value is greater than $\mu$, and at least one calibrating coefficient value is less than $\mu$, where $\mu=(L-M)/M$, L represents the first sampling rate, and M represents the second sampling rate.

In another aspect of the application, a device for converting a first digital signal having a first sampling rate into a second digital signal having a sampling rate close to or equal to a predetermined second sampling rate is provided. The device includes a numeric controlled oscillator for generating calibrating coefficient using the first sampling rate and the second sampling rate; and an interpolation filter for interpolating the first digital signal using the calibrating coefficient to obtain the second digital signal. When the ratio of the first sampling rate to the second sampling rate is a repeating infinite decimal, the numeric controlled oscillator calculates at least two calibrating coefficient values and outputs the calibrating coefficient values according to a predetermined rule such that accumulated value of the output calibrating coefficient oscillates about accumulated value of $\mu$, where $\mu=(L-M)/M$, L represents the first sampling rate, and M represents the second sampling rate.

In another aspect of the application, a device for converting a first digital signal having a first sampling rate into a second digital signal having a sampling rate close to or equal to a predetermined second sampling rate is provided. The device includes a numeric controlled oscillator for generating calibrating coefficient using the first sampling rate and the second sampling rate; and an interpolation filter for interpolating the first digital signal using the calibrating coefficient to obtain the second digital signal. When the ratio of the first sampling rate to the second sampling rate is a repeating infinite decimal, the numeric controlled oscillator calculates at least two calibrating coefficient values and outputs the calibrating coefficient values according to a predetermined rule such that at regularly spaced points along time axis, accumulated value of the output calibrating coefficient equals to accumulated value of $\mu$, where $\mu=(L-M)/M$, L represents the first sampling rate, and M represents the second sampling rate.

In another aspect of the application, a method for converting a first digital signal having a first sampling rate into a second digital signal having a sampling rate close to a predetermined second sampling rate is provided. The method includes: when the ratio of the first sampling rate to the second sampling rate is a repeating infinite decimal, calculate at least two calibrating coefficient values and output the calibrating coefficient values according to a predetermined rule; conduct overflow operation on the output calibrating coefficient; and interpolate the first digital signal using the output calibrating coefficient and the result of the overflow operation to obtain the second digital signal such that during any period of a certain length along time axis, sampling times of the second digital signal equals to sampling times of the second sampling rate.

In some embodiments, a delta-sigma circuit may be used to control outputting the calibrating coefficient values according to the predetermined rule.

In some embodiments, a counter control circuit may be used to control outputting the calibrating coefficient values according to the predetermined rule.

In some embodiments, FIR filter, or IIR filter, or CIC filter, or HBF filter may be used to interpolate the first digital signal.

In another aspect of the application, a method for processing signal in a receiver of a communication system is provided. The method includes the method for converting a first digital signal having a first sampling rate into a second digital signal having a sampling rate close to a predetermined second sampling rate.

In another aspect of the application, a method for converting a first digital signal having a first sampling rate into a second digital signal having a sampling rate close to a predetermined second sampling rate is provided. The method includes: when the ratio of the first sampling rate to the second sampling rate is a repeating infinite decimal, calculate at least two calibrating coefficient values, at least one calibrating coefficient value is greater than $\mu$, and at least one calibrating coefficient value is less than $\mu$, where $\mu=(L-M)/M$, L represents the first sampling rate, and M represents the second sampling rate; output the calibrating coefficient values according to a predetermined rule; conduct overflow operation on the output calibrating coefficient; and interpolate the first digital signal using the output calibrating coefficient and the result of the overflow operation to obtain the second digital signal.

In another aspect of the application, a method for converting a first digital signal having a first sampling rate into a second digital signal having a sampling rate close to a predetermined second sampling rate is provided. The method includes: when the ratio of the first sampling rate to the second sampling rate is a repeating infinite decimal, calculate at least two calibrating coefficient values and output the calibrating coefficient values according to a predetermined rule such that accumulated value of the output calibrating coefficient oscillates about accumulated value of $\mu$, where $\mu=(L-M)/M$, L represents the first sampling rate, and M represents the second sampling rate; conduct overflow operation on the output calibrating coefficient; and interpolate the first digital signal using the output calibrating coefficient and the result of the overflow operation to obtain the second digital signal.

In another aspect of the application, a method for converting a first digital signal having a first sampling rate into a second digital signal having a sampling rate close to a predetermined second sampling rate is provided. The method includes: when the ratio of the first sampling rate to the second sampling rate is a repeating infinite decimal, calculate at least two calibrating coefficient values and output the calibrating coefficient values according to a predetermined rule such that at regularly spaced points along time axis, accumulated value of the output calibrating coefficient equals to accumulated value of $\mu$, where $\mu=(L-M)/M$, L represents the first sampling rate, and M represents the second sampling rate; conduct overflow operation on the output calibrating coefficient; and interpolate the first digital signal using the output calibrating coefficient and the result of the overflow operation to obtain the second digital signal.

In another aspect of the application, a digital signal processing device is provided. The device includes: a first numeric controlled oscillator for generating a first calibrating coefficient using a first sampling rate of a first digital signal and a predetermined second sampling rate and conducting overflow operation on output first calibrating coefficient; and a first interpolation filter for interpolating the first digital signal using the output first calibrating coefficient and the result of the overflow operation on the output first calibrating coefficient to obtain a second digital signal having a sampling rate close to or equal to the second sampling rate. When the ratio of the first sampling rate to the second sampling rate is a repeating infinite decimal, the first numeric controlled oscillator calculates at least two first calibrating coefficient values and outputs the first calibrating coefficient values according to a predetermined rule such that during any period of a certain length along time axis, sampling times of the second digital signal equals to sampling times of the second sampling rate.

The device further includes: a digital signal processor for processing the second digital signal; a second numeric controlled oscillator for generating a second calibrating coefficient using the second sampling rate and a predetermined third sampling rate and conducting overflow operation on output second calibrating coefficient; and a second interpolation filter for interpolating the second digital signal processed by the digital signal processor using the output second calibrating coefficient and the result of the overflow operation on the output second calibrating coefficient to obtain a third digital signal having a sampling rate close to or equal to the third sampling rate. When the ratio of the second sampling rate to the third sampling rate is a repeating infinite decimal, the second numeric controlled oscillator calculates at least two second calibrating coefficient values and outputs the second calibrating coefficient values according to a predetermined rule such that during any period of a certain length along time axis, sampling times of the third digital signal equals to sampling times of the third sampling rate.

In some embodiments, the first sampling rate may be integer times of the third sampling rate.

In another aspect of the application, a receiver of a communication system is provided. The receiver includes the digital signal processing device.

In another aspect of the application, a digital signal processing device is provided. The device includes: a first numeric controlled oscillator for generating a first calibrating coefficient using a first sampling rate of a first digital signal and a predetermined second sampling rate, and conducting overflow operation on output first calibrating coefficient; and a first interpolation filter for interpolating the first digital signal using the output first calibrating coefficient and the result of the overflow operation on the output first calibrating coefficient to obtain a second digital signal having a sampling rate close to or equal to the second sampling rate. When the ratio of the first sampling rate to the second sampling rate is a repeating infinite decimal, the first numeric controlled oscillator calculates at least two first calibrating coefficient values and outputs the first calibrating coefficient values according to a predetermined rule. At least one first calibrating coefficient value is greater than $\mu_1$, and at least one first calibrating coefficient value is less than $\mu_1$, where $\mu_1=(L-M)/M$, L represents the first sampling rate, and M represents the second sampling rate.

The device further includes: a digital signal processor for processing the second digital signal; a second numeric controlled oscillator for generating a second calibrating coefficient using the second sampling rate and a predetermined third sampling rate and conducting overflow operation on output second calibrating coefficient; and a second interpolation filter for interpolating the second digital signal processed by the digital signal processor using the output second calibrating coefficient and the result of the overflow operation on the output second calibrating coefficient to obtain a third digital signal having a sampling rate close to or equal to the third sampling rate. When the ratio of the second sampling rate to the third sampling rate is a repeating infinite decimal, the second numeric controlled oscillator calculates at least two second calibrating coefficient values and outputs the second calibrating coefficient values according to a predetermined rule. At least one second calibrating coefficient value is greater than $\mu_2$, and at least one second calibrating coefficient value is less than $\mu_2$, where $\mu_2=(M-N)/N$, N represents the third sampling rate.

In another aspect of the application, a digital signal processing device is provided. The device includes: a first numeric controlled oscillator for generating first calibrating coefficient using a first sampling rate of a first digital signal and a predetermined second sampling rate and conducting overflow operation on output first calibrating coefficient; and a first interpolation filter for interpolating the first digital signal using the output first calibrating coefficient and the result of the overflow operation on the output first calibrating coefficient to obtain a second digital signal having a sampling rate close to or equal to the second sampling rate. When the ratio of the first sampling rate to the second sampling rate is a repeating infinite decimal, the first numeric controlled oscillator calculates at least two first calibrating coefficient values and outputs the first calibrating coefficient values according to a predetermined rule such that accumulated value of the output first calibrating coefficient oscillates about accumulated value of $\mu_1$, where $\mu_1=(L-M)/M$, L represents the first sampling rate, and M represents the second sampling rate.

The device further includes: a digital signal processor for processing the second digital signal; a second numeric controlled oscillator for generating a second calibrating coefficient using the second sampling rate and a predetermined third sampling rate and conducting overflow operation on output second calibrating coefficient; and a second interpolation filter for interpolating the second digital signal processed by the digital signal processor using the output second calibrating coefficient and the result of the overflow operation on the output second calibrating coefficient to obtain a third digital signal having a sampling rate close to or equal to the third sampling rate. When the ratio of the second sampling rate to the third sampling rate is a repeating infinite decimal, the second numeric controlled oscillator calculates at least two second calibrating coefficient values and outputs the second calibrating coefficient values according to a predetermined rule such that accumulated value of output second coefficient oscillates about accumulate value of $\mu_2$, where $\mu_2=(M-N)/N$, and N represents the third sampling rate.

In another aspect of the application, a digital signal processing device is provided. The device includes: a first numeric controlled oscillator for generating first calibrating coefficient using a first sampling rate of a first digital signal and a predetermined second sampling rate and conducting overflow operation on output first calibrating coefficient; and a first interpolation filter for interpolating the first digital signal using the output first calibrating coefficient and the result of the overflow operation on the output first calibrating coefficient to obtain a second digital signal having a sampling rate close to or equal to the second sampling rate. When the ratio of the first sampling rate to the second sampling rate is a repeating infinite decimal, the first numeric controlled oscillator calculates at least two first calibrating coefficient values and outputs the first calibrating coefficient values according to a predetermined rule such that at regularly spaced points along time axis, accumulated value of the output first calibrating coefficient equals to accumulated value of $\mu_1$, where $\mu_1=(L-M)/M$, L represents the first sampling rate, and M represents the second sampling rate.

The device further includes: a digital signal processor for processing the second digital signal; a second numeric controlled oscillator for generating a second calibrating coefficient using the second sampling rate and a predetermined third sampling rate and conducting overflow operation on output second calibrating coefficient; and a second interpolation filter for interpolating the second digital signal processed by the digital signal processor using the output second calibrating coefficient and the result of the overflow operation on the output second calibrating coefficient to obtain a third digital signal having a sampling rate close to or equal to the third sampling rate. When the ratio of the second sampling rate to the third sampling rate is a repeating infinite decimal, the second numeric controlled oscillator calculates at least two second calibrating coefficient values and outputs the second calibrating coefficient values according to a predetermined rule such that at regularly spaced points along time axis, accumulated value of output second coefficient equals to accumulate value of $\mu_2$, where $\mu_2=(M-N)/N$, and N represents the third sampling rate.

In another aspect of the application, a digital signal processing method is provided. The method includes: receive a first digital signal having a first sampling rate; when the ratio of the first sampling rate to a predetermined second sampling rate is a repeating infinite decimal, calculate at least two first calibrating coefficient values using the first sampling rate and the second sampling rate, and output the first calibrating coefficient values according to a predetermined rule; conduct overflow operation on the output first calibrating coefficient; and interpolate the first digital signal using the output first calibrating coefficient and the result of the overflow operation on the output first calibrating coefficient to obtain a second digital signal such that during any period of a certain length along time axis, sampling times of the second digital signal equals to sampling times of the second sampling rate.

The method further includes: process the second digital signal; when the ratio of the second sampling rate to a predetermined third sampling rate is a repeating infinite decimal, calculate at least two second calibrating coefficient values using the second sampling rate and the third sampling rate, and output the second calibrating coefficient values according to a predetermined rule; conduct overflow operation on the output second calibrating coefficient; and interpolate the processed second digital signal using the output second calibrating coefficient and the result of the overflow operation on the output second calibrating coefficient to obtain a third digital signal such that during any period of a certain length along time axis, sampling times of the third digital signal equals to sampling times of the third sampling rate.

In some embodiments, the first sampling rate may be integer times of the third sampling rate.

In another aspect of the application, a digital signal processing method is provided. The method includes: receive a first digital signal having a first sampling rate; and when the ratio of the first sampling rate to a predetermined second sampling rate is a repeating infinite decimal, calculate at least two first calibrating coefficient values using the first sampling rate and the second sampling rate. At least one first calibrating coefficient value is greater than $\mu_1$, and at least one first calibrating coefficient value is less than $\mu_1$, where $\mu_1=(L-M)/M$, L represents the first sampling rate, and M represents the second sampling rate.

The method further includes: output the first calibrating coefficient values according to a predetermined rule; conduct overflow operation on the output first calibrating coefficient values; and interpolate the first digital signal using the output first calibrating coefficient and the result of the overflow operation on the output first calibrating coefficient to obtain a second digital signal having a sampling rate close to the second sampling rate.

The method further includes: process the second digital signal; and when the ratio of the second sampling rate to a predetermined third sampling rate is a repeating infinite decimal, calculate at least two second calibrating coefficient values using the second sampling rate and the third sampling rate. At least one second calibrating coefficient value is greater than $\mu_2$, and at least one second calibrating coefficient value is less than $\mu_2$, where $\mu_2=(M-N)/N$, and N represents the third sampling rate.

The method further includes: output the second calibrating coefficient values according to a predetermined rule; conduct overflow operation on the output second calibrating coefficient; and interpolate the processed second digital signal using the output second calibrating coefficient and the result of the overflow operation on the output second calibrating coefficient to obtain a third digital signal having a sampling rate close to the third sampling rate.

In another aspect of the application, a digital signal processing method is provided. The method includes the following operations: receive a first digital signal having a first sampling rate; when the ratio of the first sampling rate to a predetermined second sampling rate is a repeating infinite decimal, calculate at least two first calibrating coefficient values using the first sampling rate and the second sampling rate; output the first calibrating coefficient values according to a predetermined rule such that accumulated value of the output first calibrating coefficient oscillates about accumulated value of $\mu_1$, where $\mu_1=(L-M)/M$, L represents the first sampling rate, and M represents the second sampling rate; conduct overflow operation on the output first calibrating coefficient values; and interpolate the first digital signal using the output first calibrating coefficient and the result of the overflow operation on the output first calibrating coefficient to obtain a second digital signal having a sampling rate close to the second sampling rate.

The method further includes: process the second digital signal; when the ratio of the second sampling rate to a predetermined third sampling rate is a repeating infinite decimal, calculate at least two second calibrating coefficient values using the second sampling rate and the third sampling rate; output the second calibrating coefficient values according to a predetermined rule such that accumulated value of the output second calibrating coefficient oscillates about accumulated value of $\mu_2$, where $\mu_2=(M-N)/N$, and N represents the third sampling rate; conduct overflow operation on the output second calibrating coefficient; and interpolate the processed second digital signal using the output second calibrating coefficient and the result of the overflow operation on the output second calibrating coefficient to obtain a third digital signal having a sampling rate close to the third sampling rate.

In another aspect of the application, a digital signal processing method is provided. The method includes the following operations: receive a first digital signal having a first sampling rate; when the ratio of the first sampling rate to a predetermined second sampling rate is a repeating infinite decimal, calculate at least two first calibrating coefficient values using the first sampling rate and the second sampling rate; output the first calibrating coefficient values according to a predetermined rule such that at regularly spaced points along time axis, accumulated value of the output first calibrating coefficient equals to accumulated value of $\mu_1$, where $\mu_1=(L-M)/M$, L represents the first sampling rate, and M represents the second sampling rate; conduct overflow operation on the output first calibrating coefficient; and interpolate the first digital signal using the output first calibrating coefficient and the result of the overflow operation on the output first calibrating coefficient to obtain a second digital signal having a sampling rate close to the second sampling rate.

The method further includes: process the second digital signal; when the ratio of the second sampling rate to a predetermined third sampling rate is a repeating infinite decimal, calculate at least two second calibrating coefficient values using the second sampling rate and the third sampling rate; output the second calibrating coefficient values according to a predetermined rule such that at regularly spaced points along time axis, accumulated value of the output second calibrating coefficient equals to accumulated value of $\mu_2$, where $\mu_2=(M-N)/N$, and N represents the third sampling rate; conduct overflow operation on the output second calibrating coefficient; and interpolate the processed second digital signal using the output second calibrating coefficient and the result of the overflow operation on the output second calibrating coefficient to obtain a third digital signal having a sampling rate close to the third sampling rate.

For one data rate conversion, the devices and methods of the present application only need one interpolation filter to interpolate a signal to be converted, and need no PLL (phase locked loop) to provide clock signal to digital-to-analogue converter. Therefore, chip area and power consumption can be reduced. Furthermore, the devices and methods of the present application can be compatible with any sampling rate in a predetermined range, it makes their application flexible.

BRIEF DESCRIPTION OF THE DRAWINGS

The accompanying drawings are included to provide a further understanding of the present application and are incorporated in and constitute a part of this specification. The drawings illustrate the embodiments of the present application and together with the description serve to explain the principles of the application. Other embodiments of the present application and many of the intended advantages of the present application will be readily appreciated, as they become better understood by reference to the following detailed description. The elements of the drawings are not necessarily to scale relative to each other. Like reference numerals designate corresponding similar parts.

DETAILED DESCRIPTION OF ILLUSTRATED EMBODIMENTS

In the following detailed description, reference is made to various specific embodiments of the invention. These embodiments are described with sufficient detail to enable those skilled in the art to understand the application. It is to be understood that other embodiments may be employed, and that various structural, logical and electrical changes may be made without departing from the spirit or scope of the application. In describing the preferred embodiments, specific terminology will be resorted to for the sake of clarity. However, it is not intended that the application be limited to the specific terms so selected and it is to be understood that each specific term includes all technical equivalents which operate in a similar manner to accomplish a similar purpose. For example, the word connected or terms similar thereto are often used. They are not limited to direct connection but include connection through other circuit element where such connection is needed.

Figure 1:
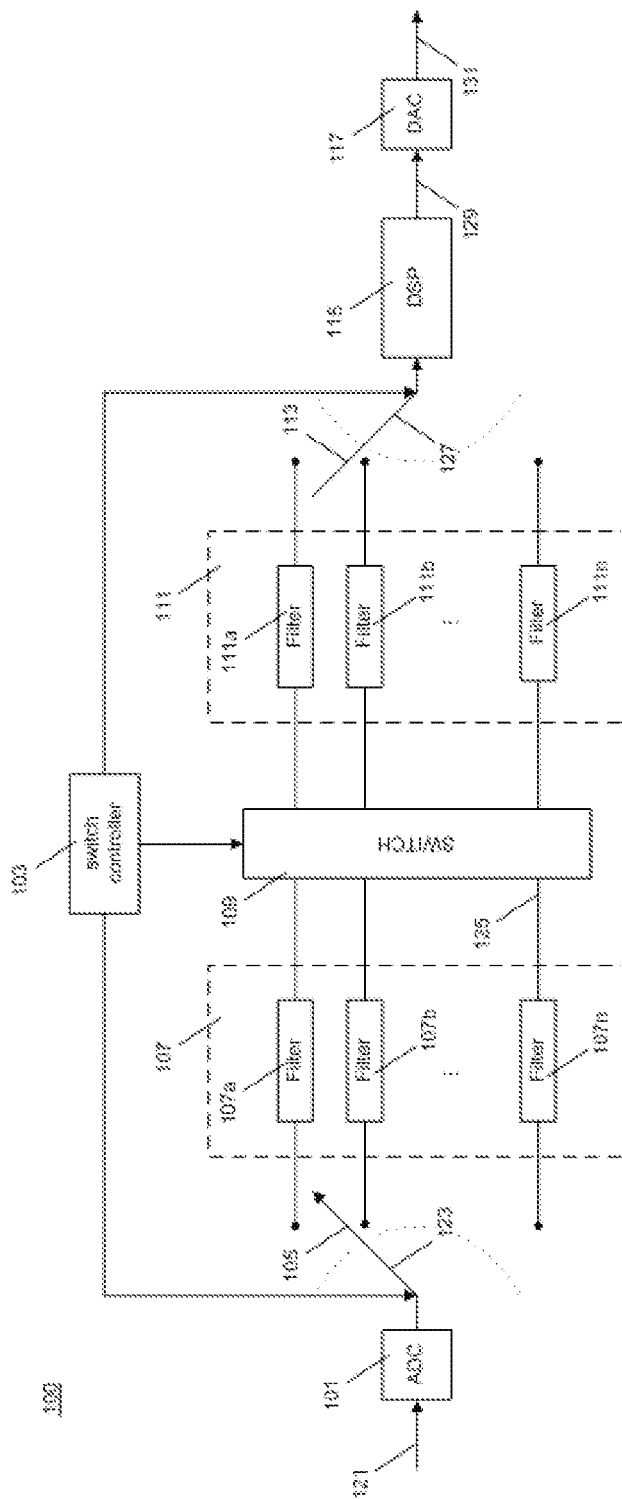
FIG. 1 illustrates a block diagram of a prior art receiver.

FIG. 1 illustrates a block diagram of a prior art receiver 100. The receiver 100 includes an analogue-to-digital converter 101, a switch controller 103, a switch 105, a synthesis filter bank 107, a switch 109, an analysis filter bank 111, a switch 113, a digital signal processor 115, and a digital-to-analogue converter 117. The synthesis filter bank 107 includes a plurality of synthesis filters 107a-107n, and the analysis filter bank 111 includes a plurality of analysis filters 111a-111n.

The analogue-to-digital converter 101 receives an analogue signal 121 from an antenna (not shown) and converts the analogue signal 121 into a digital signal 123. For noise suppression purpose, the analogue-to-digital converter 101 may convert the analogue 121 from a different channel into the digital signal 123 having a different sampling rate i.e. the sampling rate of the digital signal 123 may vary in a reasonable range.

The switch controller 103 controls the switches 105, 109, and 113 switching to a corresponding synthesis filter and a corresponding analysis filter according to the sampling rate of the digital signal 123 and a predetermined data rate, at which the signal 121 is expected to be processed by the digital signal processor 115. To simplify filters, the signal 121 is expected to be processed by the digital signal processor 115 at a fixed data rate. In other words, the sampling rate of the digital signal fed to the digital signal processor 115 is expected to be equal to a predetermined sampling rate or data rate.

The selected synthesis filter interpolates the digital signal 123 to obtain a digital signal 125 having a sampling rate much higher than that of the digital signal 123, and then the selected analysis filter interpolates the digital signal 125 to obtain a digital signal 127 having the predetermined sampling rate.

The digital signal processor 115 may conduct noise suppression and/or demodulation operations on the digital signal 127 at the predetermined data rate to obtain a digital signal 129. Then the digital-to-analogue converter converts the digital signal 129 into an analogue signal 131.

The inventors found the following disadvantages of the architecture of the receiver 100. (1) Since the digital signal 123 needs to be interpolated to obtain the digital signal 125 having a much higher sampling rate, for broad band applications, synthesis filters 107a-107n and analysis filters 111a-111n are required to work at very high frequencies, and it will increase chip area and power consumption. (2) Because parameters of the synthesis filters 107a-107n and the analysis filters 111a-111n are fixed, their combinations are limited, and this limits the application of the receiver 100. For example, a communication system includes n channels, bandwidth of each channel is 8 MHz. For noise suppression purpose, the sampling rate of the digital signal 123 may vary in a reasonable range e.g. 20-22 MHz. It is possible that for the first channel, the sampling rate of the digital signal 123 may be 20 MHz, for the second channel, the sampling rate of the digital signal 123 may be 20.2 MHz, for the third channel, the sampling rate of the digital signal 123 may be 20.5 MHz . . . . As a result, the combinations of the synthesis filters 107a-107n and the analysis filters 111a-111n may not be able to convert the digital signal 123 of all the sampling rates into the digital signal 127 having the predetermined sampling rate. To solve the problem, more synthesis filters and analysis filters are needed, and this will increase the chip area in return. In addition, when the design is fixed, the number of combinations of the synthesis filters 107a-107n and the analysis filters 111a-111n is fixed, and the receiver may be not able to process signals from newly added channels.

Figure 2:
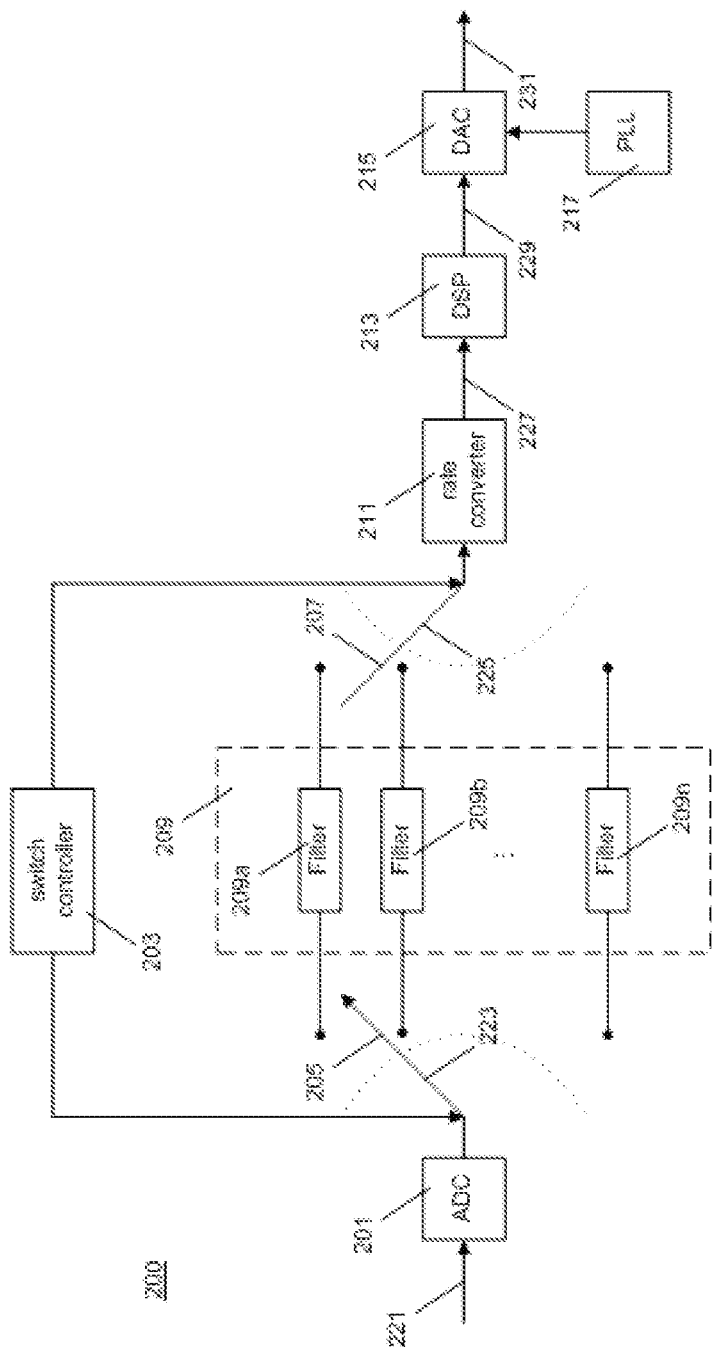
FIG. 2 illustrates a block diagram of another prior art receiver.

FIG. 2 illustrates a block diagram of another prior art receiver 200. The receiver 200 includes an analogue-to-digital converter 201, a switch controller 203, a switch 205, a switch 207, a filter bank 209, a data rate conversion device 211, a digital signal processor 213, a digital-to-analogue converter 215, and a PLL 217. The filter bank 209 includes a plurality of filters 209a-209n having different bandwidth for filtering received signals.

The analogue-to-digital converter 201 receives an analogue signal 221 from an antenna (not shown) and converts the analogue signal 221 into a digital signal 223. The switch controller 203 controls the switch 205 and the switch 207 switching to one of filters 209a-209n according to the sampling rate of the digital signal 223. The selected filter filters the digital signal 223 to obtain a digital signal 225.

The data rate converter 211 interpolates the digital signal 225 to obtain a digital signal 227 having a sampling rate equal to or close to a predetermined data rate. The digital signal processor 213 conducts noise suppression and/or demodulation operations on the digital signal 227 to obtain a digital signal 229. Then the digital-to-analogue converter 215 converts the digital signal 229 into an analogue signal 231.

When the ratio of the sampling rate of the digital signal 225 to the predetermined data rate is a repeating infinite decimal, the sampling rate of the digital signal 227 is just close to but not equal to the predetermined data rate. Hence, the digital signal processor 213 conducts the noise suppression and/or demodulation operations at the data rate equal to the sampling rate of the digital signal 227 not the predetermined data rate. Consequently, to achieve same performance, the precision requirement for anti-aliasing filter should be raised. Therefore, a plurality of filters 209a-209n having different bandwidths are included. In addition, the data rate conversion device 211 only generates one calibrating coefficient value based on the sampling rate of the digital signal 225 and the predetermined data rate, which calibrating coefficient value is just close to but not equal to p, and this will result in sampling error in the digital-to-analogue converter 215. As a result, PLL 217 must be included to adjust the clock signal of the digital-to-analogue converter 215 to prevent sampling error.

The inventors found the following disadvantages of the architecture of the receiver 200. (1) It is preferred that the number of filters of the filter bank 209 shall be no more than 3, or it will increase the chip area significantly. Therefore, the application of the receiver 200 is limited because 3 filters may not be enough for a large number of different signals. (2) The circuit of PLL 217 is complicated, it will increase the chip area and power consumption significantly.

Figure 3:
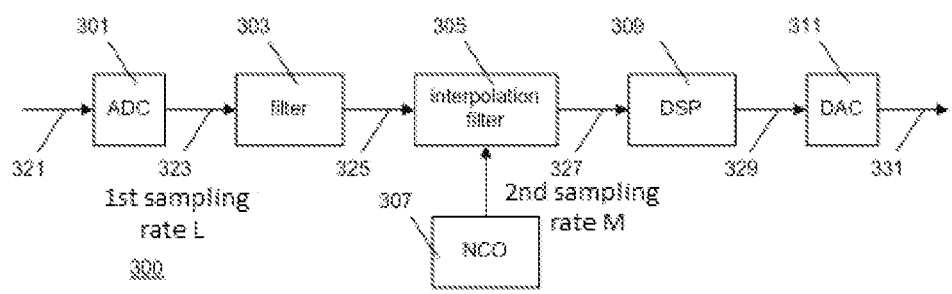
FIG. 3 illustrates an example block diagram of a receiver of one embodiment.

FIG. 3 illustrates an example block diagram of a receiver 300 of one embodiment. The receiver 300 includes an analogue-to-digital converter 301, a filter 303, an interpolation filter 305, a numeric controlled oscillator 307, a digital signal processor 309, and a digital-to-analogue converter 311.

The analogue-to-digital converter 301 receives an analogue signal 321 from an antenna (not shown) and converts it into a digital signal 323. Then the filter 303 filters the digital signal 323 for anti-aliasing purpose to obtain a digital signal 325. After that, the interpolation filter 305 interpolates the digital signal 325 under the control of the numeric controlled oscillator 307 to obtain a digital signal 327 having a sampling rate equal to or close to a predetermined data rate. The digital signal processor 309 conducts noise suppression and/or demodulation operations on the digital signal 327 to obtain a digital signal 329. Then the digital-to-analogue converter 311 converts the digital signal 329 back into an analogue signal 331.

Figure 4:
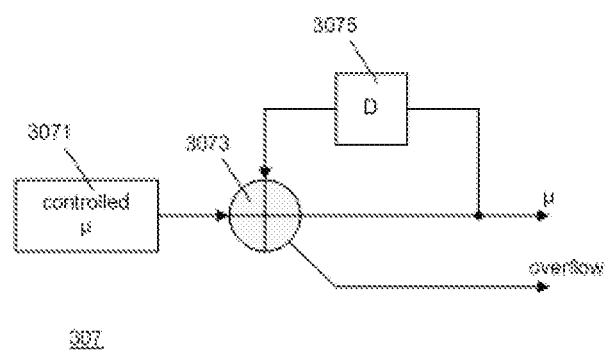
FIG. 4 illustrates an example block diagram of a numeric controlled oscillator of one embodiment.

FIG. 4 illustrates an example block diagram of the numeric controlled oscillator 307 of one embodiment. The numeric controlled oscillator 307 includes a calibrating coefficient generating circuit 3071, an accumulator 3073, and a delay device 3075.

The calibrating coefficient generating circuit 3071 generates calibrating coefficient using the sampling rate of the digital signal 325 and the predetermined data rate. When the ratio of the sampling rate of the digital signal 325 to the predetermined data rate is a repeating infinite decimal, the calibrating coefficient generating circuit 3071 calculates at least two calibrating coefficient values, and outputs the calibrating coefficient values according to a predetermined rule or arrangement.

The accumulator 3073 accumulates the output calibrating coefficient values, and compares the accumulated value with 1. If the accumulated value is greater than 1, the accumulator 3073 subtracts 1 from the accumulated value and sends an overflow signal to the interpolation filter 305. The interpolation filter 305 interpolates the digital signal 325 using the output calibrating coefficient. If the interpolation filter 305 receives an overflow signal, it does not output the current interpolation result. As a result, in any period of a certain length along time axis, the sampling times of the digital signal 327 equals to the sampling times of the predetermined data rate. In other words, during a period of an integer number of the certain length, the sampling rate of the digital signal 327 equals to the predetermined sampling rate precisely. Therefore, the digital signal processor 309 may processes the digital signal 327 at the exact predetermined data rate, thus the precision requirement for the anti-aliasing filter can be lowered, and hence only one anti-aliasing filter is needed before the interpolation filter 305. In addition, the digital-to-analogue converter 311 can sample the digital signal 329 correctly without PLL. Furthermore, the interpolation filter 305 is suitable for signal of any sampling rate in a reasonable range. In conclusion, the receiver 300 has the following advantages: flexible application, low chip area, and low power consumption etc.

When the sampling rate of the digital signal 325 will divide into the predetermined data rate, the calibrating coefficient generating circuit 3071 may calculate only one calibrating coefficient value.

In some embodiments, the calibrating coefficient generating circuit 3071 may be delta-sigma circuit. In some embodiments, the calibrating coefficient generating circuit 3071 may be counter control circuit.

Figure 5:
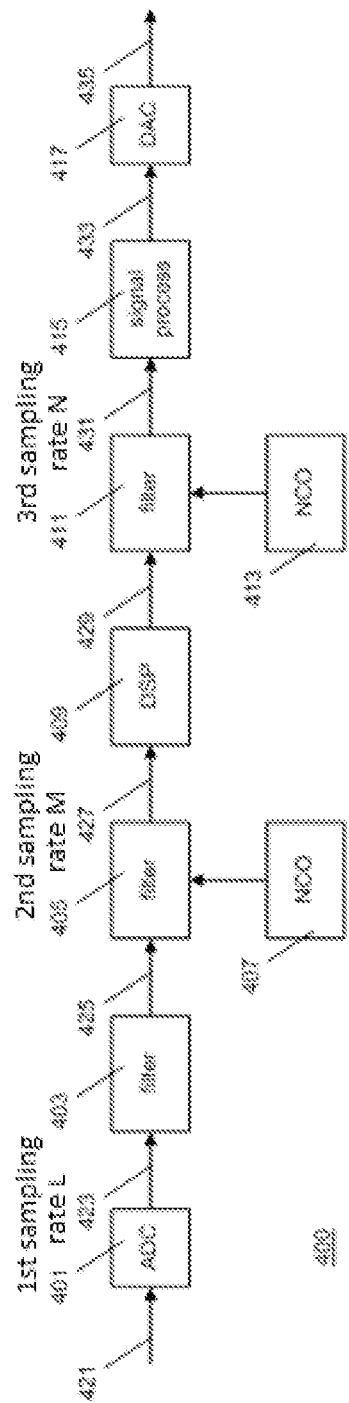
FIG. 5 illustrates an example block diagram of a receiver of another embodiment.

FIG. 5 illustrates an example block diagram of a receiver 400 of another embodiment. The receiver 400 includes an analogue-to-digital converter 401, a filter 403, a first interpolation filter 405, a first numeric controlled oscillator 407, a digital signal processor 409, a second interpolation filter 411, a second numeric controlled oscillator 413, a signal processing circuit 415, and a digital-to-analogue converter 417.

The analogue-to-digital converter 401 receives an analogue signal 421 from an antenna (not shown), and converts it into a digital signal 423 having a first sampling rate. Next, the filter 403 filters the digital signal 423 for anti-aliasing purpose to obtain a digital signal 425. Then the first interpolation filter 405 interpolates the digital signal 425 to obtain a digital signal 427 under the control of the first numeric controlled oscillator 407. The sampling rate of the digital signal 427 is equal to or close to a second predetermined data rate, at which the digital signal 427 is to be expected processed by the digital signal processor 409.

The digital signal processor 409 conducts noise suppression and/or demodulation operations on the digital signal 427 at the second predetermined data rate to obtain a digital signal 429. Then the second interpolation filter 411 interpolates the digital signal 429 to obtain a digital signal 431 under the control of the second numeric controlled oscillator 413. The sampling rate of the digital signal 431 is equal to or close to a third predetermined data rate. In some embodiments, the first sampling rate is integer times of the third sampling rate, thus to simplify clock signal generating circuits. In some embodiments, the relationship between the sampling rate of the analogue-to-digital converter 401 and the sampling rate of the digital-to-analogue converter 417 is fixed to further simplify the clock signal generating circuits.

The signal processing circuit may conduct up-sampling and/or modulation operations on the digital signal 431 to obtain a digital signal 433. Finally, the digital-to-analogue converter 417 converts the digital signal 433 into an analogue signal 435. The function of the signal processing circuit is not limited to up-sampling and modulation.

In some embodiments, the first interpolation filter 405 and the second interpolation filter 411 may be FIR filter, or IIR filter, or CIC filter, or HBF filter.

Figure 6:
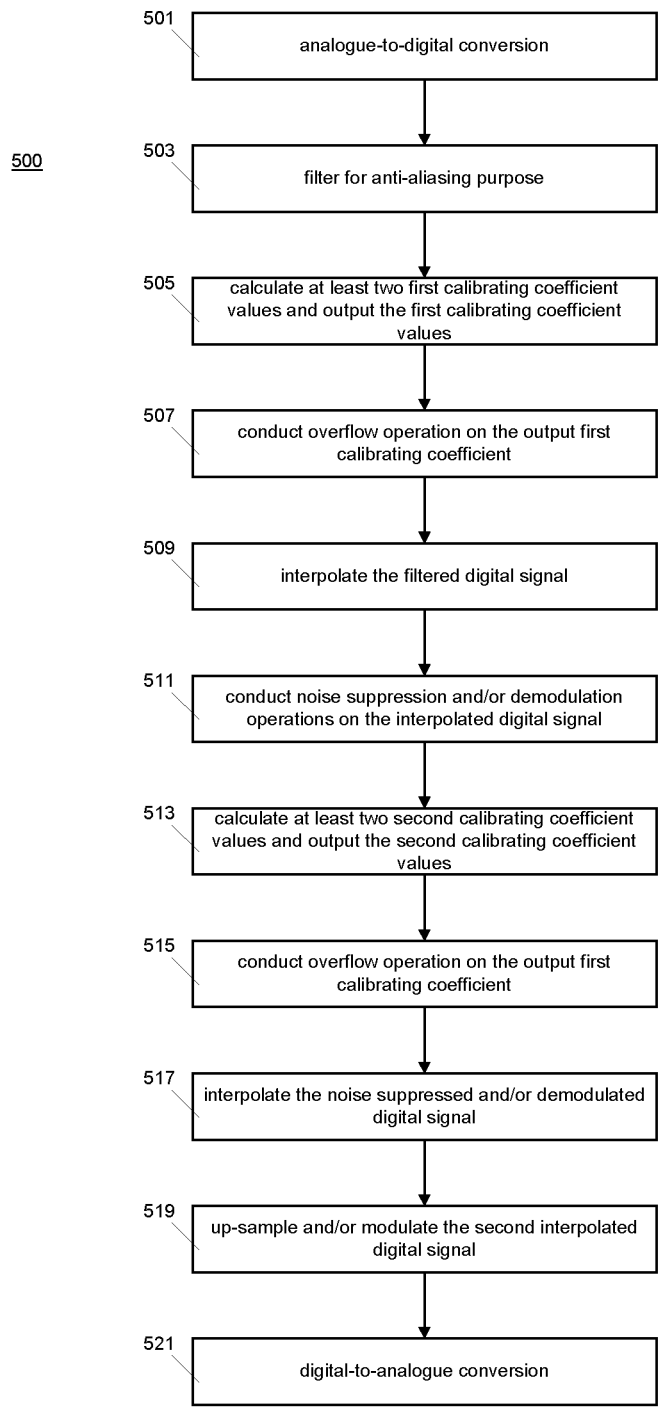
FIG. 6 illustrates an example flowchart of a data rate conversion method of one embodiment.

FIG. 6 illustrates an example flowchart of a data rate conversion method 500 of one embodiment. The method 500 includes the following operations: (501) convert a received analogue signal into a digital signal having a first sampling rate; (503) filter the analogue-to-digital converted digital signal for anti-aliasing purpose; (505) when the ratio of the first sampling rate to a predetermined second sampling rate is a repeating infinite decimal, calculate at least two first calibrating coefficient values using the first sampling rate and the second sampling rate, and output the first calibrating coefficient values according to a predetermined rule or arrangement; (507) conduct overflow operation on the output first calibrating coefficient; (509) interpolate the filtered digital signal using the output first calibrating coefficient and the result of the overflow operation to obtain a digital signal having a sampling rate such that during any period of a certain length the sampling times of the interpolated digital signal equals to sampling times of the second sampling rate; and (511) conduct noise suppression and/or demodulation operations on the interpolated digital signal.

The method 500 further includes: (513) when the ratio of the second sampling rate to a predetermined third sampling rate is a repeating infinite decimal, calculate at least two second calibrating coefficient values using the second sampling rate and the third sampling rate, and output the second calibrating coefficient values according to a predetermined rule or arrangement; (515) conduct overflow operation on the output second calibrating coefficient; (517) interpolate the noise suppressed and/or demodulated digital signal using the output second calibrating coefficient and the result of the overflow operation on the output second calibrating coefficient to obtain a digital signal such that in any period of a certain length, sampling times of the second interpolated digital signal equal to the sampling times of the third sampling rate; (519) up-sample and/or modulate the second interpolated digital signal; and (521) convert the up-sampled and/or modulated digital signal into an analogue signal.

In some embodiments, in operation (507), accumulate the output first calibrating coefficient and compare the accumulated value with a predetermined value, if the accumulated value is greater than the predetermined value, output an overflow signal and subtract the predetermined value from the accumulated value.

In an embodiment utilizing counter control method, we define:

$$\mu = L/M - 1 = B/Q \qquad \text{equation (1)}$$

where, $\mu$ represents conventional calibrating coefficient, L represents current sampling rate, and M represents target sampling rate i.e. the predetermined data rate.

To synchronize the converted sampling rate and the target sampling rate, we define:

$$K\frac{B}{Q} = m\frac{A}{2^p} + n\frac{A+1}{2^p} = (m+n)\frac{A}{2^p} + n\frac{1}{2^p} \qquad \text{equation (2)}$$

where, $$\frac{A}{2^p} < \frac{B}{Q} < \frac{A+1}{2^p},$$

p represents bit width of the calibrating coefficient, and K represents a certain length of period during which sampling times of the rate converted digital signal equal to sampling times of the target sampling rate. The greater the p is, the more precision the system has, and the more complex the calculation is.

If K=SQ, there is $$SB = (m+n)\frac{A}{2^p} + n\frac{1}{2^p} \qquad \text{equation (3)}$$

Therefore, n=mod(SB$2^p$, A), and $$m = \frac{SB2^p - n}{A} - n.$$

Assuming S=1, and K=Q, and requiring K=m+n, because A=floor(B/Q*2P), there is

QA=B$2^p$-t, and t=B$2^p$-AQ=n.

As a result, $$Q = \frac{B2^p - n}{A} = m - n \qquad \text{equation (4)}$$

Example (1)

L=32 KHz*1000=32 MHz, where L represents current sampling rate,
M=32 KHz*855=27.36 MHz, where M represents target sampling rate,
let p=15, there is:
B=1000-855=145,
Q=855,
$\mu$=145/855,
A=floor(145/855*$2^{15}$)=5557,
n=mod(145*$2^{15}$,5557)=125, and m=730
Generate two calibrating values:
$\mu_1$=A/$2^p$=5557/$2^{15}$, and
$\mu_2$=A+1/$2^p$=5558/$2^{15}$, where
$\mu_1 < \mu < \mu_2$.

Accumulate the output calibrating values and compare the accumulated value with $2^{15}/2^{15}$=1. If the accumulated value is greater than 1, subtract 1 from the accumulated value and output an overflow signal.

In some embodiments, $\mu_1$ and $\mu_2$ may be expressed in integers. In one example, $\mu_1$=5557, and $\mu_2$=5558. The accumulated value is compared with $2^{15}$.

In every 855 outputs of calibrating coefficient, there are 730 times of $\mu_1$ and 125 times of $\mu_2$ such that during period of a length of 855 sampling times of the target sampling rate, the number of sampling times of the interpolated digital signal equals to 855.

In the example, during any period of a length of 855 sampling times of the target sampling rate along time axis, there is an accumulated value of the output calibrating coefficient equal to the accumulated value of $\mu$. The accumulated value of the output calibrating coefficient oscillates about the accumulated value of $\mu$. According to the example, any sampling rate in a reasonable range may be converted such that during period of a certain length along time axis, the number of sampling times of the interpolated digital signal equals to the sampling times of the target sampling rate, therefore, the application is flexible.

Example (2)

L=32 MHz
M=32 KHz*793=25.376 MHz
let p=15, there is:
B=1000-793=207
Q=793
A=floor(207/793*$2^{15}$)=8553
n=mod(145*$2^{15}$,8553)=447, and
m=346.
Generate two calibrating values:
$\mu_1$=A/$2^p$=8553/$2^{15}$, and
$\mu_2$=A+1/$2^p$=8554/$2^{15}$.

Accumulate the output calibrating values and compare the accumulated value with $2^{15}/2^{15}$=1. If the accumulated value is greater than 1, subtract 1 from the accumulated value and output an overflow signal.

In every 793 output calibrating coefficient values, there are 346 times of $\mu_1$ and 447 times of $\mu_2$ such that during period of a length of 793 sampling times of the target sampling rate along time axis, the number of sampling times of the interpolated digital signal equals to 793.

For convenience of description, in the above examples, only two calibrating coefficient values are generated, but it will be appreciated that more than two calibrating coefficient values can be generated to interpolate a digital signal to be rate converted.

Figure 7:
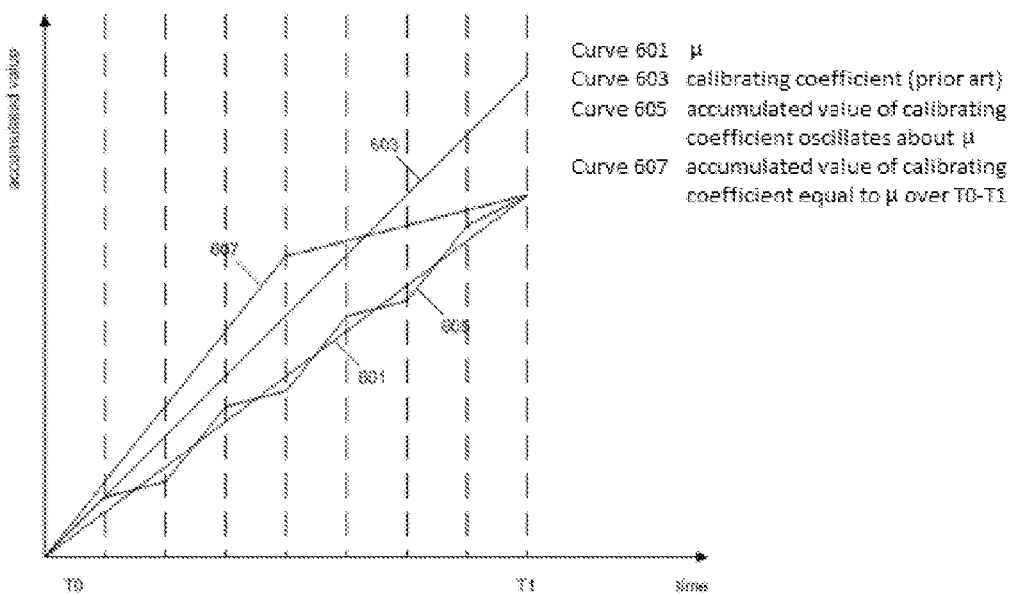
FIG. 7 illustrates diagram showing accumulated value of output calibrating coefficient of some embodiments, accumulated value of p, and accumulated value of output calibrating coefficient of prior art.

FIG. 7 illustrates diagram showing accumulated value of output calibrating coefficient of some embodiments, accumulated value of p, and accumulated value of output calibrating coefficient of prior art. In the diagram, the accumulated value of p of one embodiment is plotted as line 601, the accumulated value of calibrating coefficient of a conventional receiver is plotted as line 603, the accumulated value of the output calibrating coefficient of one embodiment is plotted as line 605, and the accumulated value of the output calibrating coefficient of another embodiment is plotted as line 607 with time as the ordinate and accumulated value as the abscissa.

As can be seen, the difference between the line 603 and the line 601 gets greater over time. Therefore, PLL must be introduced to provide clock signal to DAC to prevent sampling error.

The line 605 oscillates about the line 601, and the line 605 and the line 601 intersect at T1. In other words, the accumulated value of the output calibrating coefficient equals to the accumulated value of μ at T1.

The line 607 goes above the line 601, and the line 607 and the line 601 intersect at T1. In other words, the accumulated value of the output calibrating coefficient equals to the accumulated value of μ at T1.

It will be appreciated that in the above embodiments, the accumulated value of the output calibrating coefficient equals to the accumulated value of μ at T1, at T2 (not shown) which is spaced from T1 the interval of T0-T1 along time axis, at T3 (not shown) which is spaced from T2 the interval of T0-T1 along time axis, and so on. In other words, the accumulated value of the output calibrating coefficient equals to the accumulated value of μ at regularly spaced points along time axis.

We claim:

1. A device for converting a first digital signal having a first sampling rate into a second digital signal having a sampling rate equal to a predetermined second sampling rate comprising:
    a numeric controlled oscillator for generating calibrating coefficient using the first sampling rate and the second sampling rate; and
    an interpolation filter for interpolating the first digital signal using the calibrating coefficient to obtain the second digital signal,
    when the ratio of the first sampling rate to the second sampling rate is a repeating infinite decimal, the numeric controlled oscillator calculating at least two calibrating coefficient values and outputting the calibrating coefficient values according to a predetermined rule such that an accumulated value of the output calibrating coefficient oscillates about an accumulated value of μ, or at regularly spaced points along time axis, the accumulated value of the output calibrating coefficient equals to the accumulated value of μ, where $$\mu = (L-M)/M,$$

L represents the first sampling rate, and M represents the second sampling rate.

2. A device of claim 1, wherein the numeric controlled oscillator conducts overflow operation on the output calibrating coefficient, and sends to the interpolation filter the result of the overflow operation for controlling the validity of output of the interpolation filter.

3. A device of claim 1, wherein the numeric controlled oscillator comprises a delta-sigma circuit for controlling output the calibrating coefficient values according to the predetermined rule.

4. A device of claim 1, wherein the numeric controlled oscillator comprises a counter control circuit for controlling output the calibrating coefficient values according to the predetermined rule.

5. A device of claim 1, wherein the interpolation filter is FIR filter.

6. A receiver of a communication system comprising the device of claim 1.

7. A method for converting a first digital signal having a first sampling rate into a second digital signal having a sampling rate equal to a predetermined second sampling rate, wherein the first digital signal is converted from an analogue signal by an analogue-to-digital converter, the method comprising:
    when the ratio of the first sampling rate to the second sampling rate is a repeating infinite decimal, calculating at least two calibrating coefficient values, through a numeric controlled oscillator, and outputting the calibrating coefficient values according to a predetermined rule such that an accumulated value of the output calibrating coefficient oscillates about an accumulated value of μ, where $$\mu = (L-M)/M,$$

L represents the first sampling rate, and M represents the second sampling rate;
    conducting overflow operation on the output calibrating coefficient; and
    interpolating the first digital signal using the output calibrating coefficient and the result of the overflow operation to obtain the second digital signal.

8. A method for converting a first digital signal having a first sampling rate into a second digital signal having a sampling rate equal to a predetermined second sampling rate, wherein the first digital signal is converted from an analogue signal by an analogue-to-digital converter, the method comprising:
    when the ratio of the first sampling rate to the second sampling rate is a repeating infinite decimal, calculating at least two calibrating coefficient values, through a numeric controlled oscillator, and outputting the calibrating coefficient values according to a predetermined rule such that at regularly spaced points along time axis, an accumulated value of the output calibrating coefficient equals to an accumulated value of μ, where $$\mu = (L-M)/M,$$

L represents the first sampling rate, and M represents the second sampling rate;
    conducting overflow operation on the output calibrating coefficient; and
    interpolating the first digital signal using the output calibrating coefficient and the result of the overflow operation to obtain the second digital signal.

9. A digital signal processing device comprising:
    a first numeric controlled oscillator for generating first calibrating coefficient using a first sampling rate of a first digital signal and a predetermined second sampling rate and conducting overflow operation on output first calibrating coefficient;
    a first interpolation filter for interpolating the first digital signal using the output first calibrating coefficient and the result of the overflow operation on the output first calibrating coefficient to obtain a second digital signal having a sampling rate close to or equal to the second sampling rate,
    when the ratio of the first sampling rate to the second sampling rate is a repeating infinite decimal, the first numeric controlled oscillator calculating at least two first calibrating coefficient values and outputting the first calibrating coefficient values according to a predetermined rule such that an accumulated value of the output first calibrating coefficient oscillates about an accumulated value of $\mu_1$, where $$\mu_1 = (L-M)/M,$$

L represents the first sampling rate, and M represents the second sampling rate;
a digital signal processor for processing the second digital signal;
a second numeric controlled oscillator for generating a second calibrating coefficient using the second sampling rate and a predetermined third sampling rate and conducting overflow operation on output second calibrating coefficient; and
a second interpolation filter for interpolating the second digital signal processed by the digital signal processor using the output second calibrating coefficient and the result of the overflow operation on the output second calibrating coefficient to obtain a third digital signal having a sampling rate equal to the third sampling rate;
when the ratio of the second sampling rate to the third sampling rate is a repeating infinite decimal, the second numeric controlled oscillator calculating at least two second calibrating coefficient values and outputting the second calibrating coefficient values according to a predetermined rule such that an accumulated value of output second coefficient oscillates about an accumulate value of $\mu_2$, where $\mu_2=(M-N)/N$, and N represents the third sampling rate.

10. A device of claim 9, wherein the first sampling rate is integer times of the third sampling rate.

11. A digital signal processing device comprising:
a first numeric controlled oscillator for generating first calibrating coefficient using a first sampling rate of a first digital signal and a predetermined second sampling rate and conducting overflow operation on output first calibrating coefficient;
a first interpolation filter for interpolating the first digital signal using the output first calibrating coefficient and the result of the overflow operation on the output first calibrating coefficient to obtain a second digital signal having a sampling rate equal to the second sampling rate,
when the ratio of the first sampling rate to the second sampling rate is a repeating infinite decimal, the first numeric controlled oscillator calculating at least two first calibrating coefficient values and outputting the first calibrating coefficient values according to a predetermined rule such that at regularly spaced points along time axis, an accumulated value of the output first calibrating coefficient equals to an accumulated value of $\mu_1$, where $\mu_1=(L-M)/M$, L represents the first sampling rate, and M represents the second sampling rate;
a digital signal processor for processing the second digital signal;
a second numeric controlled oscillator for generating a second calibrating coefficient using the second sampling rate and a predetermined third sampling rate and conducting overflow operation on output second calibrating coefficient; and
a second interpolation filter for interpolating the second digital signal processed by the digital signal processor using the output second calibrating coefficient and the result of the overflow operation on the output second calibrating coefficient to obtain a third digital signal having a sampling rate equal to the third sampling rate;
when the ratio of the second sampling rate to the third sampling rate is a repeating infinite decimal, the second numeric controlled oscillator calculating at least two second calibrating coefficient values and outputting the second calibrating coefficient values according to a predetermined rule such that at regularly spaced points along time axis, an accumulated value of output second coefficient equals to an accumulated value of $\mu_2$, where $\mu_2=(M-N)/N$, and N represents the third sampling rate.

12. A device of claim 11, wherein the first sampling rate is integer times of the third sampling rate.

13. A digital signal processing method comprising:
receiving a first digital signal having a first sampling rate, wherein the first digital signal is converted from an analogue signal by an analogue-to-digital converter;
when the ratio of the first sampling rate to a predetermined second sampling rate is a repeating infinite decimal, calculating at least two first calibrating coefficient values, through a numeric controlled oscillator, using the first sampling rate and the second sampling rate;
outputting the first calibrating coefficient values according to a predetermined rule such that an accumulated value of the output first calibrating coefficient oscillates about an accumulated value of $\mu_1$, where $\mu_1=(L-M)/M$, L represents the first sampling rate, and M represents the second sampling rate;
conducting overflow operation on the output first calibrating coefficient values;
interpolating the first digital signal using the output first calibrating coefficient and the result of the overflow operation on the output first calibrating coefficient to obtain a second digital signal having a sampling rate equal to the second sampling rate;
processing the second digital signal;
when the ratio of the second sampling rate to a predetermined third sampling rate is a repeating infinite decimal, calculating at least two second calibrating coefficient values, through a numeric controlled oscillator, using the second sampling rate and the third sampling rate;
outputting the second calibrating coefficient values according to a predetermined rule such that an accumulated value of the output second calibrating coefficient oscillates about an accumulated value of $\mu_2$, where $\mu_2=(M-N)/N$, N represents the third sampling rate;
conducting overflow operation on the output second calibrating coefficient; and
interpolating the processed second digital signal using the output second calibrating coefficient and the result of the overflow operation on the output second calibrating coefficient to obtain a third digital signal having a sampling rate equal to the third sampling rate.

14. A method of claim 13, wherein the first sampling rate is integer times of the third sampling rate.

15. A digital signal processing method comprising:
receiving a first digital signal having a first sampling rate, wherein the first digital signal is converted from an analogue signal by an analogue-to-digital converter;
when the ratio of the first sampling rate to a predetermined second sampling rate is a repeating infinite decimal, calculating at least two first calibrating coefficient values, through a numeric controlled oscillator, using the first sampling rate and the second sampling rate;

outputting the first calibrating coefficient values according to a predetermined rule such that at regularly spaced points along time axis, an accumulated value of the output first calibrating coefficient equals to an accumulated value of $\mu_1$, where $$\mu_1 = (L-M)/M,$$

L represents the first sampling rate, and M represents the second sampling rate;

conducting overflow operation on the output first calibrating coefficient;

interpolating the first digital signal using the output first calibrating coefficient and the result of the overflow operation on the output first calibrating coefficient to obtain a second digital signal having a sampling rate equal to the second sampling rate;

processing the second digital signal;

when the ratio of the second sampling rate to a predetermined third sampling rate is a repeating infinite decimal, calculating at least two second calibrating coefficient values, through a numeric controlled oscillator, using the second sampling rate and the third sampling rate;

outputting the second calibrating coefficient values according to a predetermined rule such that at regularly spaced points along time axis, an accumulated value of the output second calibrating coefficient equals to an accumulated value of $\mu_2$, where $$\mu_2 = (M-N)/N,$$

N represents the third sampling rate;

conducting overflow operation on the output second calibrating coefficient; and interpolating the processed second digital signal using the output second calibrating coefficient and the result of the overflow operation on the output second calibrating coefficient to obtain a third digital signal having a sampling rate equal to the third sampling rate.

16. A method of claim 15, wherein the first sampling rate is integer times of the third sampling rate.

* * * * *